US005773854A

United States Patent [19]
Pasch

[11] Patent Number: 5,773,854
[45] Date of Patent: Jun. 30, 1998

[54] METHOD OF FABRICATING A LINEARLY CONTINUOUS INTEGRATED CIRCUIT GATE ARRAY

[75] Inventor: Nicholas F. Pasch, Pacifica, Calif.

[73] Assignee: LSI Logic Corporation, Milpitas, Calif.

[21] Appl. No.: 892,827

[22] Filed: Jul. 15, 1997

Related U.S. Application Data

[63] Continuation of Ser. No. 473,543, Jun. 7, 1995, Pat. No. 5,659,189.

[51] Int. Cl.⁶ .................................................. H01L 27/10
[52] U.S. Cl. .......................... 257/202; 257/203; 257/210
[58] Field of Search .................................... 257/202, 203, 257/210, 207, 208, 211; 438/129, 598, 599

[56] References Cited

U.S. PATENT DOCUMENTS 4,984,050  1/1991  Kobayashi .............................. 257/210
5,109,265  4/1992  Utesch et al. ........................... 257/210
5,440,153  8/1995  Male et al. .............................. 257/207

Primary Examiner—Mahshid D. Saadat
Assistant Examiner—S. V. Clark
Attorney, Agent, or Firm—Oppenheimer Wolff & Donnelly LLP

[57] ABSTRACT

A semiconductor device includes a configuration having an array of logic gates electrically connected with an array of input/output (I/O) circuit devices, and also electrically connecting with an array of connector pads by which electrical connection with the semiconductor device may be effected. The array of logic gates is linearly continuous and is unbounded along at least a first axis through to boundaries imposed an edge of the semiconductor wafer. The arrays of I/O circuit devices and connector pads are disposed adjacent, and in one embodiment parallel, to the array of logic gates. Integrated circuit structures including a customized number of individual logic gate elements may be easily provided by cutting a selected length from the strip-like portion of the array of logic gates. Requisite connector pad and I/O circuit features are provided by the adjacent arrays of I/O circuit devices and the adjacent array of connector pads.

21 Claims, 4 Drawing Sheets

METHOD OF FABRICATING A LINEARLY CONTINUOUS INTEGRATED CIRCUIT GATE ARRAY

This application is a continuation of U.S. patent application Ser. No. 08/473,543 filed Jun. 7, 1995, now U.S. Pat. No. 5,659,189.

BACKGROUND OF THE INVENTION

1. Field of the Invention

The present invention relates to a gate array type integrated circuit structures, and more particularly, relates to a gate array type integrated circuit structure having a novel layout configuration that optimizes manufacturing flexibility.

2. Related Technology

Many conventional integrated circuit structures are formed from repetitive arrays of logic gates. Such integrated circuits are frequently made on substrates of silicon or other semiconductor material, which is processed in the form of a thin wafer having one or more separate integrated circuit devices or die areas on its surface. Conventional integrated circuits or dies typically in many thousands of individual transistors, diodes, and other circuit elements. After the formation of these circuits is completed in each of the die areas, the wafer is then scribed or cut between the dies to physically separate these dies for subsequently packaging and use. The packaging structure usually provides electrical connections from the small-scale circuits on the die to electrical circuitry outside of the package, as well as physical and environmental protection to the packaged circuit die.

Conventionally, integrated circuits are commonly made using a topology or layout which in plan view is bounded on all sides. A conventional integrated circuit structure is presented at FIG. 1 of the appended drawings. Within the die area, the outer periphery of the circuit is defined by an open-centered and rectangular or square array of electrical contact pads. These electrical contact pads are arranged in four intersecting lines that bound the square or rectangular inner area of the semiconductor die. Within this perimeter of electrical contact pads is next arranged an open-centered area of input/output (I/O) devices, which may include power distribution, ground, and data transmission busses, as well as ancillary devices, such as electrostatic discharge protection features. The open-centered array of I/O devices is nested within the array of electrical contact pads, and is connected to the electrical contact pads by conductive traces on the die. These conductive traces may either be formed on a surface of the semiconductor material, and later overlaid with other material or features, or may be alternatively on the finished exterior surface of the die. The resulting integrated circuit structure thus has a first outer and open-centered perimeter area of electrical contact pads surrounding a second inner and open-centered perimeter area of I/O devices.

Within this double perimeter of electrical contact pads and I/O devices, the conventional integrated circuit layout includes a central area of logic gates that are in some applications laid out in an array type configuration. This central area is sometimes referred to as a "sea of gates", and is a form of bounded field within which the logic gates of the integrated circuit are located. These logic gates may number in the tens of thousands or hundreds of thousands in order to accomplish the information processing function for which various application specific circuits may be intended. However, the size of the logic gate array is always circumscribed by the surrounding "walls" of electrical contact pads and I/O devices in the conventional topology of an integrated circuit. This conventional layout for integrated circuit structures is commonly referred to as a "frame" type layout. The perimeter boundary of the circuit is normally termed a "scribe street". The scribing or cutting operation which separates the portions of an integrated circuit processing wafer into individual dies is conducted within these scribe streets.

The number of logic gates in a conventional integrated circuit layout is generally fixed by the available area within the surrounding perimeters of electrical contact pads and I/O devices. Consequently, conventional gate array type integrated circuit devices are normally made in graduated sizes, each size having progressively larger interior areas for the gate arrays. Conventionally, an integrated circuit may have an array of 80,000 logic gates, for example, while the next larger size of logic gate array circuit may have 100,000 gates. When a new application specific integrated circuit design is desired that requires a logic gate array of 85,000 gates, for example, the smaller 80,000 circuit structure is inadequate, while the next larger 100,000 circuit structure is clearly oversized and much more expensive than required to do the intended job.

Much of the cost of integrated circuits is often greatly influenced by the size of the circuit chip, the number of contacts used on the circuit chip, and the size and complexity of the packaging structure used to prepare the integrated circuit chip for its actual use in a circuit. Consequently, the relationship between these factors and the cost of a finished integrated circuit in its package ready for use in an application, such as installation on a circuit board for a computer or other product, is not a linear relationship. In fact, the die size to cost relationship is generally a geometric relationship, and includes recognition that, with increased die size, the yield of good circuit chips from the manufacturing process goes down at a rate that is an exponential of die size.

As a result, the use of an integrated circuit with an array of 100,000 gates for an application specific integrated circuit design requiring merely 85,000 logic gates increases the cost to the consumer considerably above that which would result if a logic gate array of only the desired size were available. On the other hand, the number of logic gate circuits sometimes required for various circuit designs typically does not justify the cost and delay of designing a custom integrated circuit having just a sufficient number of logic gates for the specific application at hand.

SUMMARY OF THE INVENTION

In view of the deficiencies of conventional integrated circuits, with their necessarily fixed and circumscribed areas for logic gates, the present invention has, as a primary object, the provision of an integrated circuit design with a topology or layout providing a logic gate field that is linearly continuous.

More particularly, the present invention has as an object the provision of an integrated circuit having a topology with generally linear fields within which are disposed electrical contact pads, generally linear fields containing I/O devices that are disposed adjacent to and parallel with the contact pad fields, and generally linear fields or arrays of logic gates disposed adjacent and generally parallel with the fields of I/O devices. The linear fields of logic gates are preferably continuous within limits set by the size of the semiconductor processing wafer upon which the integrated circuits is formed. Still more particularly, the present invention has as an object the provision of an integrated having logic gate fields bounded on only one axis. These singularly-bounded logic gate field are, in one embodiment, bounded on both sides by a linear I/O device field leading to an adjacent and linear electrical contact pad field.

This aspect of the invention provides a flexibly-sized integrated circuit which may be manufactured in elongate sections with large numbers of replicated logic gates arrayed along the length of the circuit. In order to size a particular integrated circuit to a particular job, the length of the circuit is simply selected to provide the number of logic gates required by the electronic signal processing requirements of a specific integrated circuit design, and cut at the selected length. If additional logic gates are required, the lateral extent of the logic gate field may be expanded to allow the space needed for the additional logic gates. Thus, the present integrated circuit structure topology provides an integrated circuit with a logic gate field unbounded in two degrees of freedom.

Another object of the present invention is to provide a linearly continuous integrated circuit in which additional electrical contact fields or I/O device fields may be provided along the length of the linearly continuous field of arrayed gates at variably and selected locations as may be needed for interconnection of the circuit. The additional fields of contact pads or I/O devices may be transverse to the field of logic gates and permissibly may be of a length equal to the width of the gate array. However, because these additional fields of contact pads or I/O devices are an adjunct to the field of gates, they are not an interruption to the linear continuity of the gate field.

These and additional objects and advantages of the present invention will be apparent from a reading of the following detailed description of a particularly preferred exemplary embodiment of the invention, taken in conjunction with the following drawing Figures, in which the same reference numerals refer to the same feature, or to features which are analogous in structure or function.

DETAILED DESCRIPTION OF THE PREFERRED EXEMPLARY EMBODIMENTS OF THE INVENTION

Figure 1:
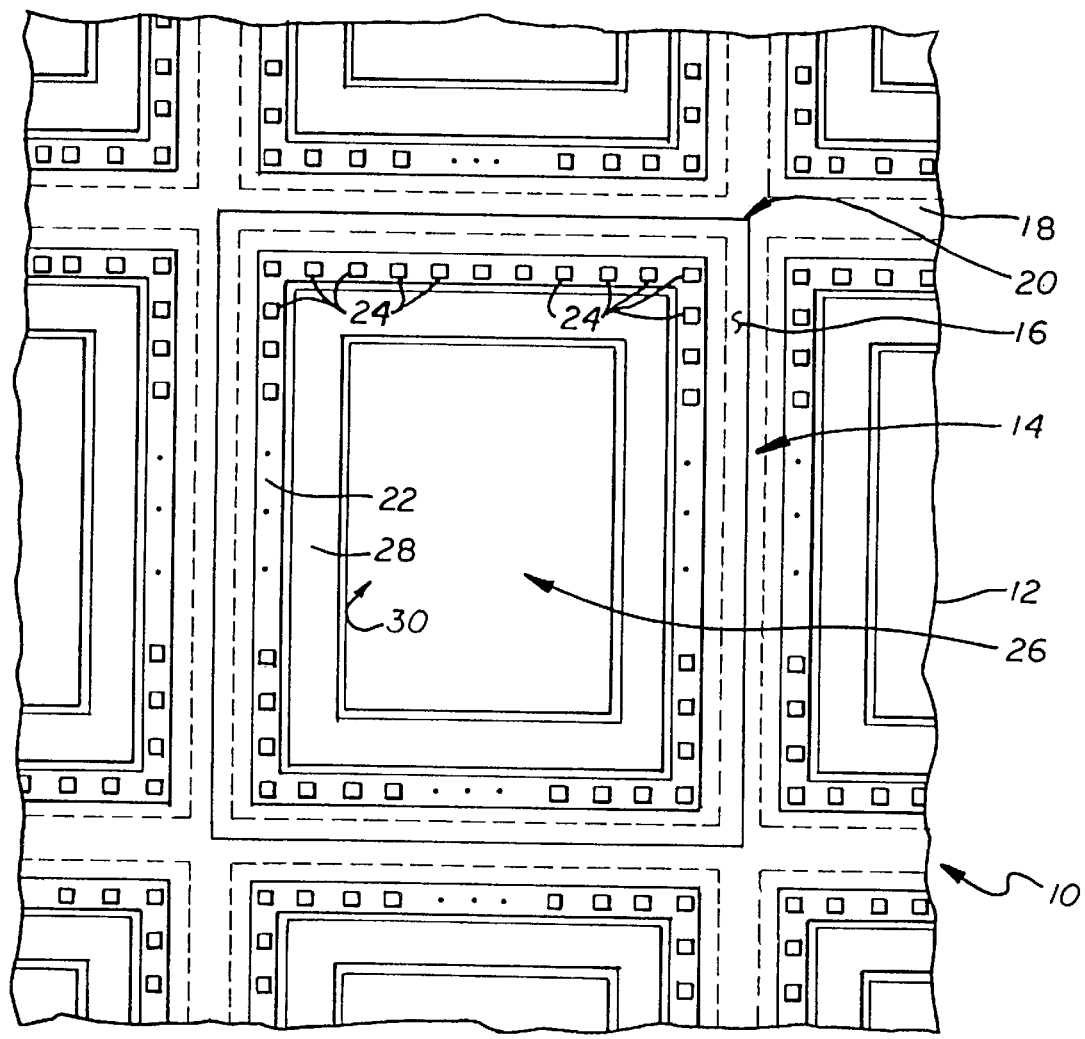
FIG. 1 provides a fragmentary and somewhat schematic plan view of conventional integrated circuit dies arrayed on a semiconductor processing wafer.

Referring to FIG. 1, there is shown a conventional semiconductor processing wafer 10 having a substrate 12 of semiconductor material upon which is formed a plurality of conventional integrated circuit dies, each generally referenced with the numeral 14. The surface 16 of the wafer 12 is divided by a grid of "scribe streets" 18, into a plurality of frames 20 (only one of which is depicted on FIG. 1) within which the individual circuit dies 14 are generally manufactured using a variety of processes. After formation of the integrated circuit dies, and electronic testing of these dies, the wafer 12 is cut apart along the scribe streets 18 to physically separate and free the individual dies 14 from one another. Once separated from the other circuit dies, each individual circuit die 14 has a perimeter or frame 20 which is defined at the boundary or edges of the small piece or "chips" of semiconductor material cut out of the wafer 10, and upon which an individual circuit die or pattern has been formed.

According to the conventional technology illustrated in FIG. 1, an integrated circuit or die is formed in each of the die areas, or frames, on a semiconductor processing wafer. Each of these circuit dies may include many tens of thousands of individual logic gates that make up the integrated circuit design. The logic gates are generally in an array or field. After formation of the circuit structure is completed in each of the die areas, the wafer is scribed or cut to separate the individual dies. The dies are subsequently and normally placed individually into a "package" for use.

Figure 2:
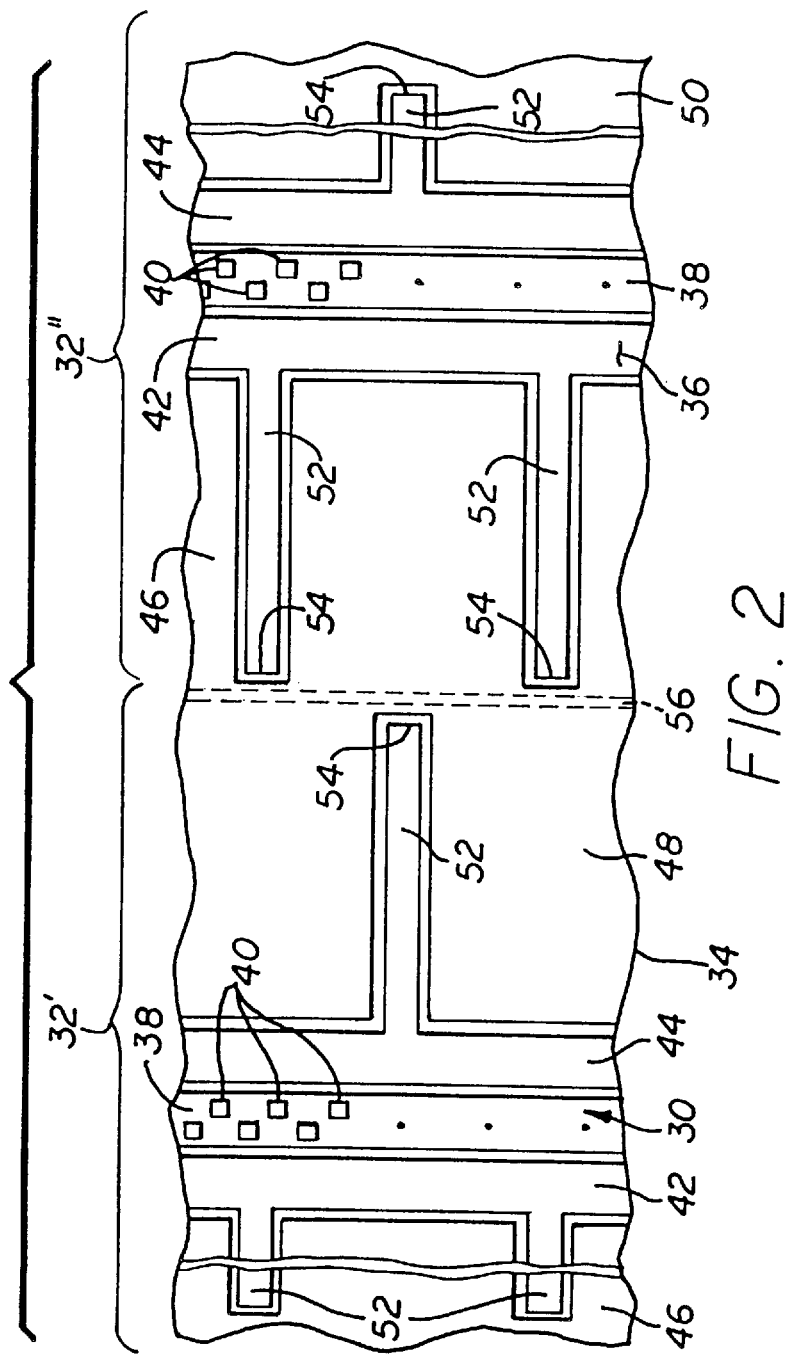
FIG. 2 is a fragmentary plan view using the same type of schematic depiction features used in FIG. 1, and depicting a repetitive and continuous integrated field according to one embodiment of the invention on a semiconductor processing wafer.

Viewing FIG. 2, and particularly the left side of this Figure, an integrated circuit 32' is seen which is of a "linear field", or "linearly continuous", nature, in accordance with one aspect of the present invention. The integrated circuit 32 is formed on a substrate 34 of semiconductor material. This substrate 34 defines a surface 36 upon which circuit features (to be further described) are defined to make out a topology for the circuit 32. More particularly, the circuit 32 includes an elongate vertically extending columnar connector pad field 38 within which is formed plural electrical connector pads 40. The columnar field 38 extends essentially from side to side of the processing wafer. That is, viewing the left side of FIG. 2, the vertical extent of the connector pad field 38 is essentially the side to side dimension of the processing wafer. Accordingly, the connector pad field 38 may be several inches long. Also, the connector pads 40 may define a single row, a pair of rows in a stair step pattern as depicted, a pair of side-by-side rows, or any other pattern of connector pads 40 which is convenient for use in interconnecting the circuit 32 to a package structure.

Next adjacent to the columnar connector pad field 38, and arranged one on each side thereof, is a pair of columnar input/output (I/O) device fields 42, 44. These I/O fields 42, 44 may also include power distribution, ground, electrostatic discharge protection, and other types of ancillary circuits. The individual I/O circuits themselves are conventional, and are not illustrated in detail on FIG. 2. Next adjacent to the columnar I/O device fields 42, 44, the integrated circuit 32 includes a pair of columnar gate array fields 46, 48. It will be noted that the gate array fields 46, 48 also extend vertically the full dimension of the processing wafer, like the I/O fields 42, 44, and connector pad field 38. Consequently, the vertical limits of the structure shown in FIG. 2 are set only by the physical limits of the processing wafer. Consequently, the length of the gate array fields 44, 46 is not bounded in the vertical direction by any topographical feature of the circuit. The gate array fields 44, 46 are linearly continuous in the vertical direction. This structure of pad fields, I/O fields, and gate array fields is repeated horizontally across the wafer 34, with the vertical extent of each field being limited only by the physical bounds of the processing wafer 34. All of the connector pads 40, I/O field circuits, and gate arrays 42, 44, etc, are interconnected by conductive traces (not shown) formed in or on the surface of the wafer 34.

In an alternative embodiment of the present invention illustrated on the right hand side of FIG. 2, the I/O fields 42, 44, etc, arranged across the integrated circuit 32 may include additional branches 52 extending horizontally into the adjacent gate array fields. These branches 52 facilitate connection of the I/O field circuits to the gate array circuits, and extend toward, but short of, the next adjacent I/O field to define ends 54 which are spaced slightly from the adjacent ends 54 of the branches extending from the next adjacent I/O field. That is, the ends 54 of the branches of adjacent I/O fields on opposite sides of a gate array field are spaced apart to define therebetween an area of continuous gate arrays through which passes a cutting street, referenced with the numeral 56. This cutting street is of arbitrary location, and is covered with logic gates in contrast to the open or bare substrate surface of the cutting streets described with respect to FIG. 1. Within this cutting street 56, the adjacent vertically-extending sections 32', 32", etc., of integrated circuit may be cut from the processing wafer 34 upon which the continuous integrated circuit structure 32 is formed.

As is seen viewing FIG. 2, when a cut is made along the street 56, the field 48 is divided into a left-hand portion with the field 38, connector pads 40 and I/O fields 42, and 44 associated therewith, and into a similar right-hand portion. Consequently, the right-hand portion of the field 48 is identified with a numeral 46", because it is associated now with the right-hand field 38, connector pads 40, etc., and is analogous to the field 46. The described structure is repetitive horizontally across the surface of the semiconductor wafer 34, like vertical ribbons of circuit structure which may be separated form one another by cutting at the streets 56.

Figure 3:
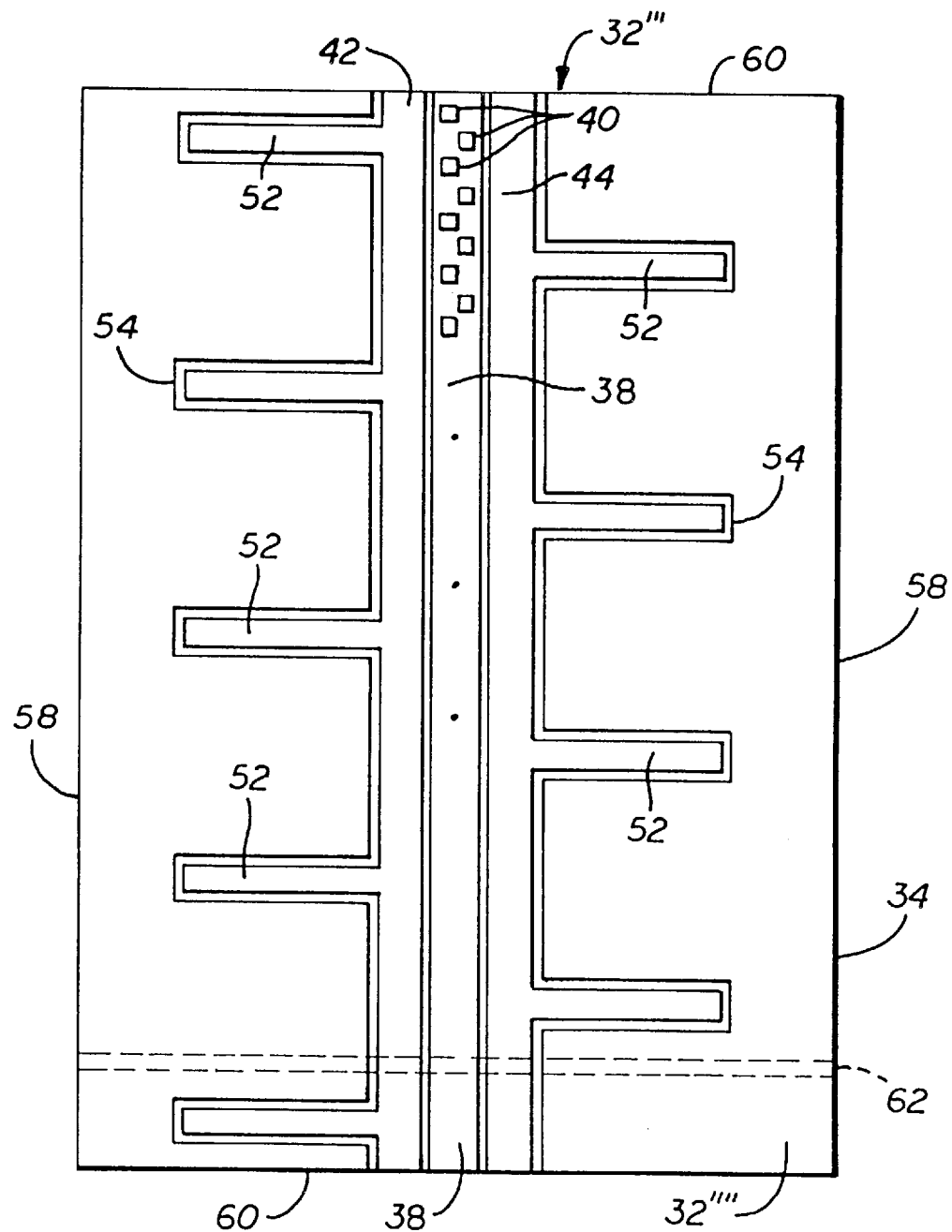
FIG. 3 shows an individual integrated circuit chip formed from the wafer depicted fragmentarily in FIG. 2.

Viewing FIG. 3, a resulting integrated circuit 32''' is depicted which has edges 58 defined by cuts conducted in the cutting streets 56 as depicted in FIG. 2. That is, a saw is passed along the cutting streets 56 of a wafer 34 as seen in FIG. 2 to free an elongate integrated circuit strip from the wafer. Also, this circuit 32''' has upper and lower edges 60 which are defined by a similar saw cut horizontally across an elongate strip of the integrated circuit as freed from the wafer by the cuts along the cutting streets 56. The circuit 32''' is thus sized to include a certain number of gates in the gate array fields 46, 48 by simply cutting the elongate circuit strip 32' to the desired length. Thus, if the circuit as depicted is required to include 120,000 gates for example, and a circuit is needed which includes only 100,000 gates, then the strip of circuit as seen in FIG. 3 would be cut at the dashed line 62 so that the portion 32''' includes 100,000 gates. The lower circuit portion 32'''', from which the saw scarf has removed some of the gates, may be used for another purpose, if desired.

After the saw cuts are made to size the circuit 32' to the number of logic gates required in the gate array fields 46, 48, the edges 58 and 60 of the circuit 32' may be sealed using a conventional sealant in order to prevent introduction of contaminants, such as moisture, for example, into the morphology of the circuit. This edge sealant will also prevent edge migration of materials out of circuit 32'. Understandably, during manufacture of custom-sized integrated circuits according to the present invention, the horizontal saw cuts are preplanned to minimize destruction of logic gates, and to provide the highest possible yield of custom-sized integrated circuits 32''', from each processing wafer.

Viewing FIG. 3, it will be seen that the integrated circuit chip 32''' displays a vertical axis of substantial symmetry along the vertically extending connector pad field 38. The fields of I/O devices 42, 44 are substantially similar on each side of the connector pad field 38. Also, the fields of arrayed logic gates 46, 48 are substantially similar on each side of the connector pad field. Consequently, the integrated circuit 32''' may be completely symmetrical along the line of the connector pad field 38.

In one alternative embodiment of this invention the symmetry of the integrated circuit chip 32''' may only be a substantial symmetry because of the non-symmetrical placement of the I/O device branches 52. On the other hand, these branches 52 could be placed symmetrically about the connector pad field 38 so that the integrated circuit chip 32''' could display true axial symmetry about the line of the connector pad field 38.

Figure 4:
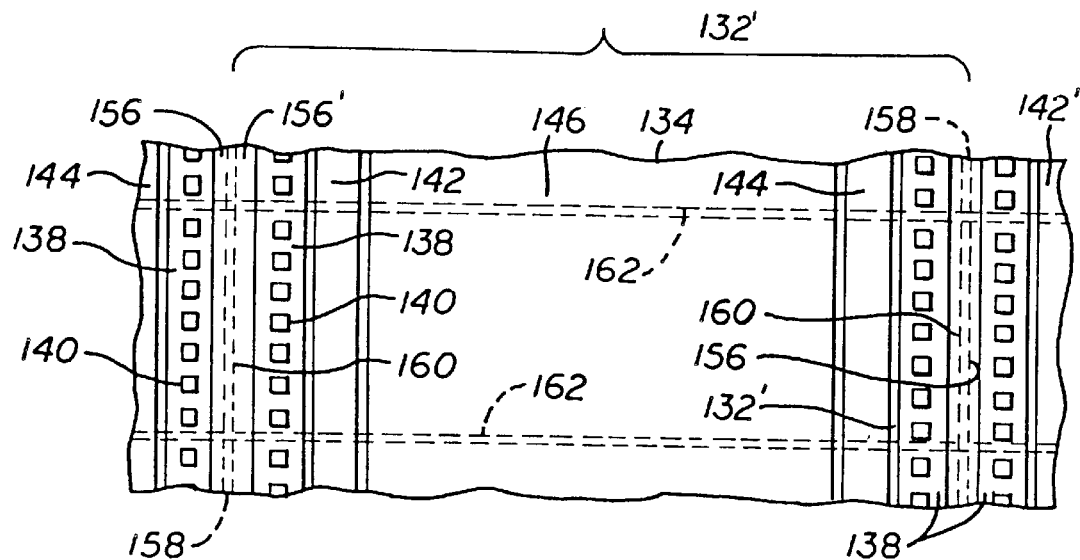
FIG. 4 provides a similar fragmentary plan view also using the same sort of schematic depiction as FIGS. 1 and 2, and showing integrated circuits according to an alternative embodiment of the invention.

For purposes of clarity, a first embodiment of the present invention is again fragmentarily illustrated in FIG. 4 in plan view on a processing wafer. In order to obtain reference numerals for use on FIG. 4, the same numeral used on FIGS. 2 and 3 is used for the same structural features or for features which are analogous in structure or function, and having 100 added thereto. Primes are used on FIGS. 4 and 5 to denote repetitive features like features already described, but which are associated with an adjacent columnar strip of integrated circuit structure.

Still viewing FIG. 4, the processing wafer is referenced with the numeral 134. Also viewing FIG. 4 it will be seen that adjacent connector pad fields 138 are separated by a columnar cutting street 156. Each connector pad field 138 is provided with plural connector pads 140, and is adjacent to and electrically connected to an I/O device field 142 or 144. The I/O fields 142 lie to the right of a connector pad field while the fields 144 lie to the left of a connector pad field, as viewed in FIG. 4.

Between the horizontally spaced apart I/O fields 142, 144, there is disposed a linearly continuous field 146 of arrayed logic gates which are electrically connected to both of the I/O fields 142, and 144 at the opposite edges thereof. That is, the logic gate field 146 is bounded by the I/O fields 144, 146 and connector pad fields 138, but is bounded in the vertical direction only by the edges of the processing wafer 134. Accordingly, a strip-like integrated circuit structure 132' may be separated from the remainder of the processing wafer by passage of a saw along the cutting streets 156 to create a saw scarf 158' defining edges 160 for the strip of integrated circuit 132'. As before, in order to size a particular integrated circuit 132 " having a selected number of logic gates in the gate array field 146, horizontal cuts are made along lines 162 which are variably spaced apart to define the gate array field 146 of selected area having required number of logic gates for the intended purpose of the integrated circuit 132".

Figure 5:
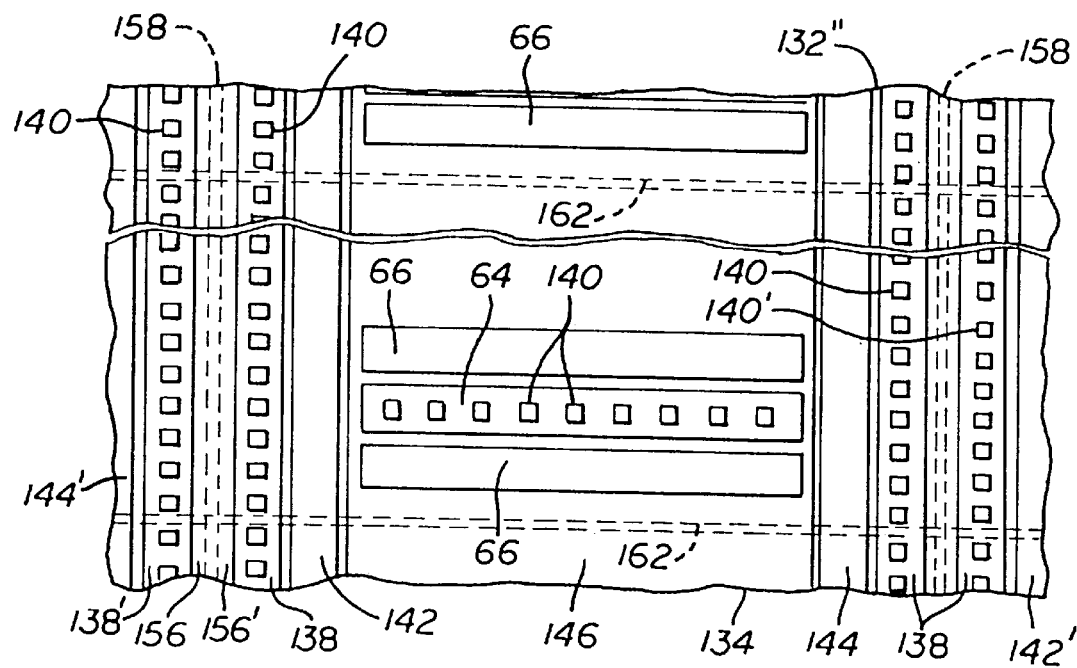
FIG. 5 provides another similar fragmentary plan view similar to FIG. 4, but depicting an alternative embodiment of the invention.

FIG. 5 depicts yet another embodiment of the invention. The same reference numerals are used in describing the structure depicted in FIG. 5 as were used on FIG. 4. The alternative embodiment illustrated in FIG. 5 can be seen to include a vertically extending columnar field 146 of arrayed logic gates bounded in the horizontal direction by fields 142, 144 of I/O devices, and connector pad fields 138 of connector pads 140. However, the logic gate field 146 has applied in it a transverse connector pad field 64 having plural connector pads 140 which are the same in function as the connector pads 140 in the connector pad field 138. On each side of the field 64 is one of a pair of transverse I/O fields 66. The connector pads 140 are electrically connected with the I/O fields 66, which are electrically connected with the surrounding logic gates by conductive traces formed in or on the surface of the substrate 12 of the wafer 134. The transverse fields 64, 66 are formed by first removing the arrayed logic interconnects from a corresponding area of the logic gate field 146, and then forming the transverse fields 64, and 66 with additional photolithographic and other fabrication processes. It should be understood that the vertically extending logic gate field 146 of the embodiment of FIG. 5 is thus unbounded, except by the physical edges of the processing wafer 134. The transverse fields 64, and 66 (or plural such transverse fields) can be formed at any desired vertical location along the columnar structure of the strip-like integrated circuit 132" in order to meet the requirements of the resulting integrated circuit for connector pads and I/O structures.

In summary the present invention can thus be seen to include the aspect of forming logic gate arrays that are not bounded on one or more sides by arrays of I/O devices and of connector pads. In a first embodiment the logic gate array extends to opposing sides of a wafer and is only bounded on one side or two opposing sides by generally parallel arrays of I/O devices and connector pads. This configuration affords substantial flexibility in the formation of specific integrated structures requiring a number of individual logic gates that is between the number of gates available with conventional "sea of gate" type designs wherein 80,000, 100,000, 200,000 or some like number of logic gates are available in a configuration bounded on all sides by I/O drivers and connector pads. If, for example, a specific integrated circuit design required 150,000 individual logic gates, the present invention would facilitate fabrication of a suitable integrated circuit structure more economically than conventional configurations, without resorting to use of conventional 200,000 logic gate structures, with 50,000 unused logic gates.

While the present invention has been depicted, described, and is defined by reference to particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

I claim:

1. An integrated circuit, comprising:
   a substrate of semiconductor material having an upper surface area;
   at least one pair of spaced apart elongated vertically extending columnar gate array fields defined on said upper surface area extending between two opposed boundary edges of said substrate;
   said gate array fields for the formation of individual logic gates therein;
   at least one pair of spaced apart elongated vertically extending columnar input/output device fields defined on said upper surface area sandwiched between said pair of gate array fields and extending between the opposed boundary edges;
   said input/output device fields for the formation of individual input/output circuits therein;
   an elongated vertically extending columnar connector pad field defined on said upper surface area sandwiched between said pair of input/output device fields and extending between the opposed boundary edges;
   said connector pad field having a plurality of electrical connector pads formed therein; and
   said logic gates, said input/output circuits and said electrical connector pads being arranged for electrical interconnection to accomplish a desired application functionality.

2. An integrated circuit according to claim 1, wherein at least one of the columnar input/output device fields includes at least one branch input/output device field defined on said upper surface area extending horizontally outwardly into an adjacent gate array field to facilitate the electrical interconnection between individual input/output devices formed therein and individual logic gates formed in the adjacent gate array field.

3. An integrated circuit according to claim 1, wherein said plurality of electrical connector pads are arranged in a single row of evenly spaced apart individual ones of said connector pads.

4. An integrated circuit according to claim 1, wherein said plurality of electrical connector pads are arranged in pairs of rows of evenly spaced apart individual ones of said connector pads have a stair step pattern.

5. An integrated circuit according to claim 1, wherein said plurality of electrical connector pads are arranged in a pair of side-by-side rows of evenly spaced apart individual ones of said connector pads.

6. An integrated circuit according to claim 2, wherein said branch field extends horizontally rightwardly into the adjacent gate array field toward, but short of, the next adjacent input/output device field.

7. An integrated circuit according to claim 2, wherein said branch field extends horizontally leftwardly into the adjacent gate array field toward, but short of, the next adjacent input/output device field.

8. An integrated circuit, comprising:
   a substrate of semiconductor material having an upper surface area;
   a plurality of pairs of spaced apart elongated vertically extending columnar gate array fields defined on said upper surface area extending between opposed boundary edges of said substrate;
   said gate array fields for the formation of individual logic gates therein to facilitate the implementation of a desired logical functionality;
   a plurality of pairs of spaced apart elongated vertically extending columnar input/output device fields defined on said upper surface area extending between the opposed boundary edges of said substrate;
   each individual pair of input/output device fields being sandwiched between associated adjacent individual pairs of said columnar gate array fields;
   said input/output device fields for the formation of individual input/output circuits therein to facilitate the implementation of a desired application functionality;
   a plurality of spaced apart elongated vertically extending columnar connector pad fields defined on said upper surface area extending between the opposed boundary edges of said substrate;
   each individual one of said connector pad fields being sandwiched between associated adjacent individual pairs of said input/output device fields and having formed therein a plurality of electrical connector pads to further facilitate the implementation of said desired application functionality;
   said logic gates, said input/output circuits and said electrical connector pads being arranged for electrical interconnection to facilitate implementation of said desired logical and application functionality purposes.

9. An integrated circuit according to claim 8, wherein at least a pair of the columnar input/output devices include at least one branch input/output device field defined on said upper surface area extending horizontally outwardly into an adjacent gate array field to facilitate the electrical interconnection between individual input/output devices formed therein and individual logic gates formed in the adjacent gate array field.

10. An integrated circuit according to claim 9, wherein at least one of said branch fields extends horizontally rightwardly into the adjacent gate array filed toward, but short of, the next adjacent input/output device field.

11. An integrated circuit according to claim 10, wherein at least another one of said branch fields extends horizontally leftwardly from the next adjacent input/output device field toward, but short of the branch filed extending horizontally rightward for defining a cutting street therebetween the branch fields.

12. An integrated circuit according to claim 11, wherein said cutting streets are utilized for facilitating the separation of one continuous integrated circuit structure from another continuous integrated circuit structure formed on said substrate.

13. An integrated circuit according to claim 8, wherein said plurality of electrical connector pads are arranged in a single column of evenly spaced apart individual ones of said connector pads.

14. An integrated circuit according to claim 8, wherein said plurality of electrical connector pads are arranged in pairs of columns of evenly spaced apart individual ones of said connector pads have a stair step pattern.

15. An integrated circuit according to claim 8, wherein said plurality of electrical connector pads are arranged in a pair of side by side columns of evenly spaced apart individual ones of said connector pads.

16. An integrated circuit according to claim 1, wherein said plurality of electrical connector pads are arranged in a single column of evenly spaced apart individual ones of said connector pads.

17. An integrated circuit according to claim 1, wherein said plurality of electrical connector pads are arranged in pairs of columns of evenly spaced apart individual ones of said connector pads having a stair step pattern.

18. An integrated circuit according to claim 1, wherein said plurality of electrical connector pads are arranged in a pair of side by side columns of evenly spaced apart individual ones of said connector pads.

19. An integrated circuit according to claim 11, wherein said substrate being separated along said cutting street to form a logic gate array extending to opposing sides of a resulting die and being bound on one side only thereof by parallel arrays of input/output devices and connector pads.

20. An integrated circuit according to claim 11, wherein said substrate being separated along said cutting street to form a logic gate array extending to opposing sides of a resulting die and being bound on both sides thereof by parallel arrays of input/output and connector pads.

21. A method of making an integrated circuit having a substrate with at least one columnar gate array extending to opposing boundary edges thereof and being bound on one side only by parallel columnar arrays of input/output devices and connector pads, comprising:

providing a substrate of semiconductor material having an upper surface area of a finite size;

defining a plurality of pairs of spaced apart elongated vertically extending columnar gate array fields on said upper surface area extending between opposed boundary edges of said substrate;

forming an array of logic gates in said gate array fields to facilitate the implementation of a desired logical functionality;

defining a plurality of pairs of spaced apart elongated vertically extending columnar input/output device fields on said upper surface area extending between opposed boundary edges of said substrate;

each individual pair of input/output device fields being sandwiched between associated adjacent individual pairs of said columnar gate array fields;

forming individual input/output devices within said input/output fields to facilitate the implementation of a desired application functionality;

forming a plurality of spaced apart elongated vertically extending columnar connector pad fields on said upper surface area extending between the opposed boundary edges of said substrate;

each individual one of said connector pad fields being sandwiched between associated adjacent individual pairs of said input/output device fields and having formed therein a plurality of electrical connector pads to further facilitate the implementation of said desired application functionality;

said logic gates, said input/output circuits and said electrical connector pads being arranged for electrical interconnection to facilitate implementation of said desired logical and application functionality purposes;

wherein at least a pair of the columnar input/output devices include at least one branch input/output device field defined on said upper surface area extending horizontally outwardly into an adjacent gate array field to facilitate the electrical interconnection between individual input/output devices formed therein and individual logic gates formed in the adjacent gate array field;

wherein one of said branch fields extends horizontally rightwardly into the adjacent gate array field toward, but short of, the next adjacent input/output device field;

wherein another one of said branch fields extends horizontally leftwardly from the next adjacent input/output device field toward, but short of, the branch field extending horizontally rightward for defining a cutting street therebetween the branch fields; and wherein said substrate is separatable along said cutting street to form a logic gate array extending to opposing sides of a resulting die and being bound on one side only thereof by parallel arrays of input/output devices and connector pads.

* * * * *